(12) United States Patent
Abdallah et al.

(10) Patent No.: US 7,553,905 B2
(45) Date of Patent: Jun. 30, 2009

(54) ANTI-REFLECTIVE COATINGS

(75) Inventors: David J. Abdallah, Bernardsville, NJ (US); Jian Yin, Bridgewater, NJ (US); Mark O. Neisser, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 233 days.

(21) Appl. No.: 11/262,639

(22) Filed: Oct. 31, 2005

(65) Prior Publication Data

US 2007/0099108 A1 May 3, 2007

(51) Int. Cl.
*G03F 7/11* (2006.01)
*C08K 5/07* (2006.01)
(52) U.S. Cl. .................. 525/154; 430/271.1; 438/952
(58) Field of Classification Search .................. None
See application file for complete search history.

(56) References Cited

U.S. PATENT DOCUMENTS

| 3,707,584 | A | * | 12/1972 | Tulacs ................ 525/518 |
| 4,064,191 | A | | 12/1977 | Parekh |
| 4,229,400 | A | | 10/1980 | Laurie |
| 4,254,235 | A | | 3/1981 | Turpin |
| 4,255,558 | A | | 3/1981 | Turpin |
| 4,487,889 | A | | 12/1984 | Craun |
| 4,491,628 | A | | 1/1985 | Ito |
| 5,069,997 | A | | 12/1991 | Schwaim et al. |
| 5,162,510 | A | | 11/1992 | Potvin et al. |
| 5,294,671 | A | * | 3/1994 | Szita et al. ............ 525/187 |
| 5,350,660 | A | | 9/1994 | Urano et al. |
| 5,371,169 | A | | 12/1994 | Lu et al. |
| 5,585,219 | A | | 12/1996 | Kaimoto et al. |
| 5,733,714 | A | * | 3/1998 | McCulloch et al. ....... 430/325 |
| 5,919,599 | A | | 7/1999 | Meador et al. |
| 5,935,760 | A | | 8/1999 | Shao et al. |
| 5,981,145 | A | | 11/1999 | Ding et al. |
| 6,187,506 | B1 | | 2/2001 | Ding et al. |
| 6,465,148 | B1 | | 10/2002 | Kang et al. |
| 6,653,411 | B2 | | 11/2003 | Puligadda et al. |
| 6,664,363 | B1 | | 12/2003 | Faunce |
| 6,689,535 | B2 | | 2/2004 | Iguchi et al. |
| 6,737,492 | B2 | | 5/2004 | Kang et al. |
| 6,894,104 | B2 | | 5/2005 | Xu et al. |
| 6,927,015 | B2 | | 8/2005 | Khojasteh et al. |
| 7,038,328 | B2 | | 5/2006 | Enomoto et al. |
| 2004/0102585 | A1 | | 5/2004 | Steinmetz et al. |
| 2006/0057501 | A1 | * | 3/2006 | Wu et al. ................ 430/311 |
| 2006/0228646 | A1 | | 10/2006 | Zampini et al. |

FOREIGN PATENT DOCUMENTS

| EP | 0 789 278 A2 | 8/1997 |
| EP | 0 794 458 A2 | 9/1997 |
| EP | 0 583 205 B1 | 8/1998 |
| EP | 0 987 600 B1 | 11/2003 |
| JP | 59-8770 A | 1/1984 |
| JP | 2002-14791 A | 1/2002 |
| WO | WO 97/33198 | 9/1997 |
| WO | WO 00/17712 | 3/2000 |
| WO | WO 00/67072 | 9/2000 |
| WO | WO 2004/040369 A2 | 5/2004 |
| WO | WO 2006/030320 A2 | 3/2006 |
| WO | WO 2006/085220 A2 | 8/2006 |

OTHER PUBLICATIONS

English language abstract of JP 59-8770.
English language abstract of JP 2002-14791 A.
Notification of Transmittal of the International Search Report and Written Opinion of the International Searching Authority, or the Declaration (Form PCT/ISA/220), the International Search Report (Form PCT/ISA/210), and the Written Opinion of the International Search Authority (Form PCT/ISA/237) for PCT/IB2005/003232, which corresponds to U.S. Appl. No. 11/159,002.
Office Action from U.S. Appl. No. 11/159,002.
Iwasa, et al., "Novel negative photoresist based on polar alicyclic polymers for ArF excimer laser lithography", SPIE vol. 3333, pp. 417-424, 1998, XP002369065.
Notification Concerning Transmittal of Copy of International Preliminary Report on Patentability (Chapter I of the Patent Cooperation Treaty) (Form PCT/IB/326), International Preliminary Report on Patentability (Form PCT/IB/373), and Written Opinion of the International Searching Authority (Form PCT/ISA/237) for PCT/IB2006/003074.
Notification of Transmittal of the International Search Report and the Written Opinion of the International Searching Authority, or the Declaration (Form PCT/ISA/220) for PCT/IB2006/003074, submitted Jan. 16, 2009.
International Search Report (Form PCT/ISA/210) for PCT/IB2006/003074, submitted Jan. 16, 2009.
Written Opinion of the International Searching Authority (Form PCT/ISA/237) for PCT/IB2006/003074, submitted Jan. 16, 2009.
Takei, S. et al., "New advanced BARC and gap fill materials based on sublimate reduction for 193nm lithography", Proceedings of the SPIE, vol. 6153, pp. 6513Q1-6513Q10 (2006), Mar. 2006.
Trefonas P. et al., "Organic antireflective Coatings for 193nm Lithography", Proceedings of the SPIE, vol. 3678, pp. 2-12 (1999).
Xu, G. et al., "New Antireflective Coatings for 193 nm Lithography", Proceedings of the SPIE, vol. 3333, pp. 524-531 (1998).

* cited by examiner

*Primary Examiner*—Cynthia Hamilton
(74) *Attorney, Agent, or Firm*—Sangya Jain; Alan P. Kass

(57) ABSTRACT

Novel self-crosslinking polymers are provided and which are useful in antireflective coatings to reduce outgassing.

4 Claims, No Drawings

ANTI-REFLECTIVE COATINGS

BACKGROUND OF THE INVENTION

The present invention relates to novel polymers and their use in antireflective coating compositions in reducing outgassing.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the minitiarization of semiconductor devices has led to the use of sophisticated multilevel systems to overcome difficulties associated with such minitiarization. The use of highly absorbing antireflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined by:

$$S=4(R_1R_2)^{1/2}e^{-\alpha D}$$

where, $R_1$ is the reflectivity at the resist/air or resist/top coat interface, $R_2$ is the reflectivity at the resist/substrate interface, α is the resist optical absorption coefficient, and D is the resist film thickness.

Antireflective coatings function by absorbing the radiation used for exposing the photoresist, that is, reducing $R_2$, and thereby reducing the swing ratio. Reflective notching becomes severe as the photoresist is patterned over substrates containing topographical features, which scatter light through the photoresist film, leading to linewidth variations, and in the extreme case, forming regions with complete resist loss.

Organic antireflective coatings are usually cured at temperatures above 180° C. Thus, small molecules tend to sublime out of the film during the cure. Outgassing of low molecular weight components is a problem for antireflective coatings in that the components tends to accumulate in bake ovens and in their exhaust plumbing. Sublimed materials can create defects on substrates if dislodged from surfaces on which they accumulated. The current invention uses polymers that are capable of self-crosslinking, which removes the need for low molecular weight crosslinkers.

SUMMARY OF THE INVENTION

The present invention relates to a polymer comprising a first repeat unit derived from an ethylenically unsaturated compound containing a pendant active hydrogen and a second repeat unit which is copolymerizable with the first repeat unit, with at least 10 mol % of the pendant active hydrogen in the polymer being replaced with an aminoplast, wherein the polymer self-crosslinks under acidic conditions. The present invention also relates to the use of the novel polymer in a solvent to comprise an antireflective coating composition. The antireflective coating can optionally contain an acid generator. The polymer in the antireflective coating further comprises a repeating unit with an absorbing chromophore. The repeating unit containing an absorbing chromophore can be the first repeat unit, the second repeat unit, or an additional monomer.

DETAILED DESCRIPTION OF THE INVENTION

The present invention relates to a polymer comprising a first repeat unit derived from an ethylenically unsaturated compound containing a pendant active hydrogen and a second repeat unit which is copolymerizable with the first repeat unit, with at least 10 mol % of the pendant active hydrogen in the polymer being replaced with an aminoplast, wherein the polymer self-crosslinks under acidic conditions.

The present invention also relates to the use of the novel polymer in a solvent to comprise an antireflective coating composition. The antireflective coating can optionally contain an acid generator. The polymer in the antireflective coating further comprises a repeating unit with an absorbing chromophore. The repeating unit containing an absorbing chromophore can be the first repeat unit, the second repeat unit, or an additional monomer.

As the ethylenically unsaturated compound of the first repeat unit, there may be mentioned a polymerizable compound having a pendant active hydrogen. Examples of the ethylenically unsaturated compound include, but are not limited to, for example, hydroxy containing acrylate monomers such as, for example, hydroxy ethyl acrylate, hydroxy propyl acrylate, hydroxy ethylhexyl acrylate, hydroxy butyl acrylate, hydroxy isodecyl acrylate, hydroxy lauryl acrylate, diethylene glycol monoacrylate, 2-hydroxy-3-phenoxypropyl acrylate, etc., and hydroxy containing methacrylate monomers corresponding to the above-mentioned acrylates, for example, hydroxy ethyl methacrylate, hydroxy propyl methacrylate, hydroxy ethylhexyl methacrylate, hydroxy butyl methacrylate, hydroxy isodecyl methacrylate, hydroxy lauryl methacrylate, diethylene glycol monomethacrylate, 2-hydroxy-3-phenoxypropyl methacrylate, etc.; allylic monomers, such as, for example, allyl alcohol, methallyl alcohol, alkoxylation products of allyl alcohol and methallyl alcohol with ethylene oxide, propylene oxide, and the like, and mixtures thereof, examples of which include allyl alcohol monopropoxylate and allyl alcohol monoethoxylate; styrene derivatives such as p-hydroxystyrene, m-hydroxystyrene, o-hydroxystyrene, α-methyl-p-hydroxystyrene, 4-hydroxy-2-methylstyrene, 4-hydroxy-3-methylstyrene, 3-hydroxy-2-methylstyrene, 3-hydroxy-4-methylstyrene, 3-hydroxy-5-methylstyrene; amino group-substituted monomers include aminoethyl acrylate, t-butyl aminoethyl methacrylate, aminoethyl acrylate, aminoethyl methacrylate, 2-methyl aminoethyl methacrylate, 3-aminopropyl methacrylate, 4-aminocyclohexyl methacrylate, and 4-aminostyrene, etc.; carboxylic acid group-substituted monomers include acrylic acid, methacrylic acid, crotonic acid, vinylacetic acid and the like, etc.; sulfonic acid group-substituted monomers include vinylsulfonic acid, styrenesulfonic acid, vinylbenzylsulfonic acid, methallylsulfonic acid and the like, etc., as well as the corresponding sulfonamides, and the like, etc.

As the second repeat unit, there may be mentioned, for example, aromatic vinyl compounds, such as styrene, a-methylstyrene, 4-methylstyrene, m-methylstyrene, 4-acetoxystyrene, 4-carboxystyrene, 4-aminostyrene, 4-methoxystyrene, 1,3-dimethylstyrene, tertbutylstyrene, vinylnaphthalene, and the like, etc.; alkyl methacrylates such as methyl methacrylate, ethyl methacrylate, butyl methacrylate, hexyl methacrylate, 2-ethylhexyl methacrylate, cyclohexyl methacrylate, octyl methacrylate, dodecyl methacrylate, etc.; vinyl ethers such as ethyl vinyl ether, propyl vinyl ether, butyl vinyl ether, octyl vinyl ether, methoxyethyl vinyl ether, ethoxyethyl vinyl ether, hydroxyethyl vinyl ether, benzyl vinyl ether, tetrahydrofurfuryl vinyl ether, phenyl vinyl ether, tolyl vinyl ether and the like, etc.; alkyl acrylates such as methyl acrylate, ethyl acrylate, butyl acrylate, hexyl acrylate, 2-ethylhexyl acrylate, cyclohexyl acrylate, octyl acrylate, dodecyl acrylate, etc.; aryl methacrylates or alkylaryl methacrylates such as phenyl methacrylate, benzyl methacrylate; aryl acrylates or alkylaryl acrylates such as phenyl acrylate, benzyl acrylate; vinyl ethers and esters, etc. In essence, it is possible to use any other monomer customarily used for the preparation of polymers used in antireflective compositions that does not contain a pendent active hydrogen and which can polymerize with the first repeat unit as the second repeat unit.

Additionally, additional monomers, different or the same as the second repeat unit, can be made part of the polymer to form, for example, terpolymers, tetrapolymers, and the like.

When the polymers of the present invention are used in antireflective compositions, absorption of the antireflective composition may be as an absorbing chromophore in the polymer or as an additive dye. It is preferred to use an absorbing chromophore in the polymer as it reduces the potential for additional volatile components in the composition.

Examples of an absorbing chromophore are hydrocarbon aromatic moieties and heterocyclic aromatic moieties with from one to four separate or fused rings, where there are 3 to 10 atoms in each ring. Examples of monomers with absorbing chromophores that can be polymerized with the first repeat unit and the second repeat unit include vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. Other chromophores are described in U.S. Pat. Nos. 6,114,085, 5,652,297, 5,981,145, 5,939,236, 5,935,760 and 6,187,506, which may also be used, and are incorporated herein by reference. The preferred chromophores are vinyl compounds of substituted and unsubstituted phenyl, substituted and unsubstituted anthracyl, and substituted and unsubstituted naphthyl; and more preferred monomers are styrene, hydroxystyrene, acetoxystyrene, vinyl benzoate, vinyl 4-tertbutylbenzoate, ethylene glycol phenyl ether acrylate, phenoxypropyl acrylate, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinyinaphthalene, N-vinylphthalimide, N-(3-hydroxy)phenyl methacrylamide, N-(3-hydroxy-4-nitrophenylazo)phenyl methacrylamide, N-(3-hydroxyl-4-ethoxycarbonylphenylazo)phenyl methacrylamide, N-(2,4-dinitrophenylaminophenyl)maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, 3-(4-nitrophenyl)azoacetoacetoxy ethyl methacrylate, benzyl methacrylate, and 3-(4-methoxycarbonylphenyl)azoacetoacetoxy ethyl methacrylate.

In some instances, the monomer containing the absorbing chromophore can be the same as the first repeat unit; for example, hydroxystyrene, which contains both an absorbing chromophore component and a pendant active hydrogen. In this case, the second repeat unit can be any other monomer that can polymerize with hydroxystyrene. In other instances where the first repeat unit only has a pendant active hydrogen, then the second repeat unit can be any monomer that polymerizes with the first repeat unit, in which case an additional monomer unit containing an absorbing chromophore would have be added, or the second repeat unit can be any monomer that polymerizes with the first repeat unit as well as containing an absorbing chromophore (for example, styrene or benzyl methacrylcate, and the like), in which case an additional monomer containing an absorbing chromophore would be optional. It is preferable that when the first repeat unit only has a pendant active hydrogen, the second repeat unit contains an absorbing chromophore.

In still other instances, it may be beneficial to add a polyol during the reaction when the active hydrogen on the first repeat unit is replaced by an aminoplast. The addition of the polyol can reduce the k value, absorption parameter, of films formed by the antireflective composition. Examples of useful polyols are shown below.

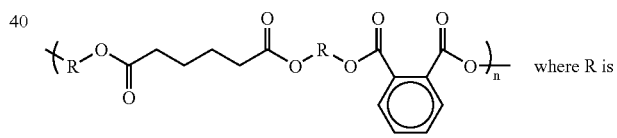 where R is

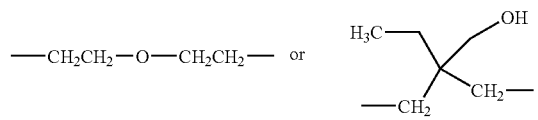

Poly[trimethylolpropane/di(propylene glycol)-alt-adipic acid/phthalic anhydride], average $M_n$~500

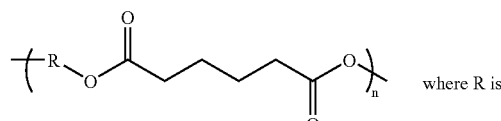 where R is

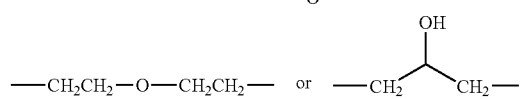

Poly[di(ethylene glycol)/glycerol-alt-adipic acid], average $M_n \sim 2,500$

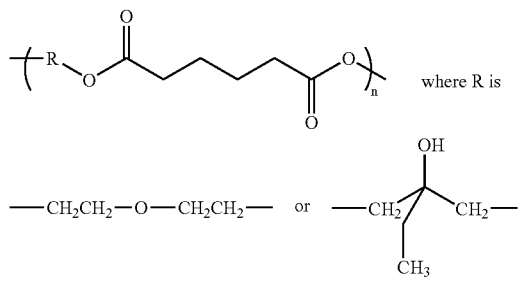

Poly[di(ethylene glycol)/trimethylolpropane-alt-adipic acid], average $M_n \sim 2,300$ The term hydrocarbyl as employed herein means any unsubstituted or substituted aliphatic, cycloaliphatic, aromatic, or aryl groups and any combination thereof.

Alkoxyalkyl refers to an alkoxy group, as defined herein, appended to an alkyl group, as defined herein. Exemplary alkoxyalkyl groups include methoxymethyl, methoxyethyl, isopropoxymethyl, and the like.

Alkylol refers to a hydroxy group, as defined herein, appended to an alkyl group (alkyl refers to branched or straight chain acyclic alkyl group comprising one to about twenty carbon atoms (preferably one to about eight carbon atoms, more preferably one to about six carbon atoms). Exemplary lower alkyl groups include methyl, ethyl, n-propyl, isopropyl, n-butyl, isobutyl, sec-butyl, t-butyl, pentyl, neopentyl, iso-amyl, hexyl, octyl, and the like.)

The polymer of the present invention can have as the first repeat unit a formula

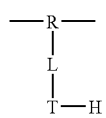

wherein R is the recurring first repeat unit moiety which is part of the polymer backbone;

L is a linking group; and

T is $CO_2$, CSO, O, S, $NR_7$, $CONR_7$, $SO_3$, $PO_3$, or $SO_2NR_7$ wherein $R_7$ is a hydrocarbyl radical hydrogen, where at least 10 mol % of H is replaced with an aminoplast.

L, as a linking group, includes divalent hydrocarbon radicals such as: alkylene, cycloalkylene, arylene, aralkylene, or alkarylene radicals containing from 1 to 20 carbon atoms, more preferably from 2 to 12 carbon atoms.

Alkylene refers to a divalent group derived from a straight or branched chain saturated hydrocarbon having from 1 to 20 carbon atoms by the removal of two hydrogen atoms, for example —$CH_2$—, —$CH_2CH_2$—, —$CH(CH_3)$—, —$CH_2CH_2CH_2$—, —$CH_2C(CH_3)_2CH_2$— and the like.

Cycloalkylene refers to mono- or bicyclic divalent ring-containing groups containing in the range of about 3 up to about 15 carbon atoms which can be unsubstituted or substituted by one or more substituents as set forth below.

Arylene refers to divalent aromatic groups typically having in the range of 6 up to 14 carbon atoms which can be unsubstituted or substituted by one or more substituents as set forth below.

Alkarylene refers to alkyl-substituted divalent aryl groups typically having in the range of about 7 up to 16 carbon atoms which can be unsubstituted or substituted by one or more substituents as set forth below.

Aralkylene refers to aryl-substituted divalent alkyl groups typically having in the range of about 7 up to 16 carbon atoms which can be unsubstituted or substituted by one or more substituents as set forth below.

Aryl as used herein refers to a mono- or bicyclic carbocyclic ring system having one or two aromatic rings including, but not limited to, phenyl, naphthyl, tetrahydronaphthyl, indanyl, indenyl and the like, which can be unsubstituted or substituted by one or more substituents as set forth below.

The above groups can be unsubstituted or substituted with substituents independently selected from loweralkyl, halo, haloalkyl, haloalkoxy, hydroxyalkyl, alkenyloxy, alkoxy, alkoxyalkoxy, alkoxycarbonyl, alkoxycarbonylalkenyl, (alkoxycarbonyl)thioalkoxy, thioalkoxy, amino, alkylamino, dialkylamino, aminoalkyl, trialkylaminoalkyl, aminocarbonyl, aminocarbonylalkoxy, alkanoylamino, arylalkoxy, aryloxy, mercapto, cyano, nitro, carboxaldehyde, carboxy, carboxyalkenyl, carboxyalkoxy, alkylsulfonylamino, cyanoalkoxy, (heterocyclic)alkoxy, hydroxy, hydroxalkoxy, phenyl and tetrazolylalkoxy. In addition, substituted aryl groups include tetrafluorophenyl and pentafluorophenyl.

Examples of L include phenylene, biphenylene, naphthylene, methylene, ethylene, 1,3-propylene, 1,4-butylene, phenylmethylene (—$C_6H_4$—$CH_2$—). The divalent hydrocarbon portion of L may be further substituted with radicals that do not interfere with the coupling function of the active hydrogen moiety. Preferred examples of such non-interfering substituents are alkyl, aryl, alkyl- or aryl-substituted silyl radicals, and fluoro substituents.

Other examples of L include —C(=O)O—$(CH_2)_n$— where n is an integer from 1 to 10.

The group T-H in the previous formula thus may be —COOH, —CSOH, —OH, —SH, —$CONR_7H$, —$SO_3H$, —$PO_3H$, —$SO_2NR_7H$ or —$NR_7H$ group, wherein R preferably is a $C_{1-18}$, preferably a $C_{1-10}$ hydrocarbyl radical or hydrogen, and H is hydrogen. Preferred $R_7$ groups are alkyls, cycloalkyls, aryls, arylalkyls, or alkylaryls of 1 to 18 carbon atoms, more preferably those of 1 to 12 carbon atoms. Most preferably, the group T-H is —OH or —$NR_7H$.

Examples of aminoplasts useful in the present invention include those, such as, for example, glycoluril-formaldehyde resins, melamine-formaldehyde resins, benzoguanamine-formaldehyde resins, and urea-formaldehyde resins.

Monomeric, methylated glycoluril-formaldehyde resins are useful for preparing thermosetting polyester anti-reflective coatings which can be used in conjunction with acid-sensitive photoresists.

Glycoluril-formaldehyde resins can have a formula

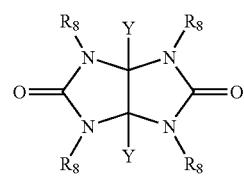

wherein Y is selected from H, an alkyl group of from 1 to 20 carbon atoms, an aryl group of from 6 to 20 carbon atoms, and an aralkyl group of from 7 to 20 carbon atoms, and wherein each $R_8$ is independently selected from H, an alkylol group and an alkoxyalkyl group.

One example is N,N,N,N-tetrahydroxymethylglycoluril (when $R_8$ is alkylol) and another is N,N,N,N-tetra(alkoxymethyl)glycoluril (when $R_8$ is alkoxyalkyl). Examples of N,N,N,N-tetra(alkoxymethyl)glycoluril, may include, e.g., N,N,N,N-tetra(methoxymethyl)glycoluril, N,N,N,N-tetra (ethoxymethyl)glycoluril, N,N,N,N-tetra(n-propoxymethyl) glycoluril, N,N,N,N-tetra(i-propoxymethyl)glycoluril, N,N,N,N-tetra(n-butoxymethyl)glycoluril and N,N,N,N-tetra(t-butoxymethyl)glycoluril. N,N,N,N-tetra(methoxymethyl) glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril. Similar materials are also available under the NIKALAC tradename from Sanwa Chemical (Japan).

Other aminoplast crosslinking agents are commercially available from Cytec Industries under the trademark CYMEL and from Monsanto Chemical Co. under the trademark RESIMENE. Some of other aminoplast crosslinking agents examples of such compounds are formaguanamine, acetoguanamine, methylolbenzoguanamine or alkyl ether compound thereof, such as tetramethylolbenzoguanamine, tetramethoxymethylbenzoguanamine and trimethoxymethylbenzoguanamine; 2,6-bis(hydroxymethyl)4-methylphenol or alkyl ether compound thereof.

Other possible crosslinking agents include methylolmelamines, such as hexamethylolmelamine, pentamethylolmelamine, and tetramethylolmelamine as well as etherified amino resins, for example alkoxylated melamine resins (for example, hexamethoxymethylmelamine, pentamethoxymethylmelamine, hexaethoxymethylmelamine, hexabutoxymethylmelamine and tetramethoxymethylmelamine). Various melamine and urea resins are commercially available under the Nikalacs (Sanwa Chemical Co.), Plastopal (BASF AG), or Maprenal (Clariant GmbH) tradenames.

The thermal acid generator of the present invention, when used, is a compound which, when heated to temperatures greater than 90° C. and less than 250° C., generates an acid. The acid, together with the crosslinker, crosslinks the polymer. The antireflective film after heat treatment becomes insoluble in the solvents used for coating photoresists, and furthermore, is also insoluble in the alkaline developer used to image the photoresist. Preferably, the thermal acid generator is activated at 90° C. and more preferably at 150° C., and even more preferably at 190° C. The antireflective film is heated for a sufficient length of time to crosslink the coating. Examples of thermal acid generators include, but are not limited to, onium salts, benzoin tosylates, tris(2,3-dibromopropyl)-1,3,5-triazine-2,4,6-trione, 2,4,4,6-tetrabromocyclohexadienone, cyclohexyl p-toluenesulfonates, menthyl p-toluenesulfonates, bornyl p-toluenesulfonates, cyclohexyl triisopropylbenzenesulfonates, cyclohexyl 4-methoxybenzene sulfonates, 2,1,4 diazonaphthoquinone esters of multihydroxy phenolic compounds, nitrobenzyl tosylates, such as 2-nitrobenzyl tosylate, 2,4-dinitrobenzyl tosylate, 2,6-dinitrobenzyl tosylate, 4-nitrobenzyl tosylate; nitrobenzyl benzenesulfonates such as 2-trifluoromethyl-6-nitrobenzyl 4-chlorobenzenesulfonate, as 2-trifluoromethyl-6-nitrobenzyl 4-nitro benzenesulfonate; phenolic sulfonate esters such as phenyl-4-methoxybenzenesulfonate, aromatic sulfonamides, alkyl and aryl phosphoric acids esters, and other aryl and alkyl esters and amine salts of organic sulfonic acids such as dodecylbenzylsulfonium triethylammonium salt (DDBSA:Et$_3$N). Compounds that generate a sulfonic acid upon activation are generally suitable.

Thermal acid generators are preferred over free acids, although free acids may also be used, in the novel antireflective composition, since it is possible that over time the shelf stability of the antireflective solution will be affected by the presence of the acid, if the polymer were to crosslink in solution. Thermal acid generators are only activated when the antireflective film is heated on the substrate.

Typically a thermal acid generator is present in an antireflective composition in concentration of from about 0 to 10% percent by weight, preferably from about 0.1 to 7.0 percent weight of the total of the dry components of the composition, and more preferably from about 0.1 to 5.0 percent weight of the total of the dry components of the composition.

The process used for polymerization can be any of the ones known in the art for polymerizing vinyl polymers, such as, ionic or free radical polymerization. The polymer structure formed can be composed of alternate, block or random copolymers. The weight average molecular weight of the polymer ranges from about 500 to about 1,000,000, preferably from about 1,000 to about 100,000, and more preferably from about 2,000 to about 40,000.

The monomers can be polymerized in an organic solvent, where the solvent is the same as the casting solvent of the antireflective coating, preferably PGMEA, PGME or ethyl lactate.

The coating composition comprises the polymer of the instant invention and a suitable solvent or mixtures of solvents. Other components may be added to enhance the performance of the coating, e.g. monomeric, polymeric and/or a mixture of monomeric and polymeric dyes, lower alcohols, surface leveling agents, adhesion promoters, antifoaming agents etc., all of which are well known to those skilled in the art.

The absorption of the antireflective coating can be optimized for a certain wavelength or range of wavelengths by the suitable choice of substituents on the dye functionality. Using substituents that are electron-withdrawing or electron donating generally shifts the absorption wavelength to longer or shorter wavelengths respectively. In addition, the solubility of the antireflective polymer in a particularly preferred solvent can be adjusted by the appropriate choice of substituents on the monomer.

The polymer of the antireflective coating composition is present in the range of about 1% to about 40% by total weight of solution. The exact weight used is dependent on the molecular weight of the polymer and the film thickness of the coating desired. Typical solvents, used as mixtures or alone, that can be used are propylene glycol monomethyl ether (PGME), propylene glycol monomethyl etheracetate (PGMEA), ethyl lactate, cyclopentanone, cyclohexanone, oxyisobutyric acid esters, for example, methyl-2-hydroxyisobutyrate, and gamma butyrolactone. Solvents with a lower degree of toxicity, and good coating and solubility properties are generally preferred.

Since the antireflective film is coated on top of the substrate and is further subject to dry etching it is envisioned that the film is of sufficiently low metal ion level and purity that the properties of the semiconductor device are not adversely affected. Treatments such as passing a solution of the polymer through an ion exchange column or a combination of anion and cation exchange columns, filtration, and an extraction process can be used to reduce the concentration of metal ions and to reduce particles. Metal ion levels in the polymer below 50 ppb each metal are preferred, below 10 ppb are more preferred and below 1 ppb are even more preferred.

The antireflective coating composition is coated on the substrate using techniques well known to those skilled in the art, such as dipping, spin coating or spraying. The film thickness of the antireflective coating typically ranges from about 0.01 micron to about 1 micron. Thicker coatings, especially up to 10 microns, can also be used if necessary, especially for planarization of substrates with topography. The coating is further heated on a hot plate or convection oven to remove any residual solvent and to insolubilize the film.

Photoresists coated over the antireflective film can be any of the types used in the semiconductor industry.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 300 nm to 440 nm.

High resolution, chemically amplified, deep ultraviolet (100-300 nm) positive and negative tone photoresists are available for patterning images with less than quarter micron geometries. There are two major deep ultraviolet (uv) exposure technologies that have provided significant advancement in miniaturization, and these are lasers that emit radiation at 248 nm and 193 nm. Examples of such photoresists are given in the following patents and incorporated herein by reference, U.S. Pat. No. 4,491,628, 5,350,660, EP 794458 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by eliminating the aromatic functionality. Furthermore, at lower wavelengths the reflection from the substrate becomes increasingly detrimental to the lithographic performance of the photoresist. Therefore, at these wavelengths antireflective coatings become critical.

The process of the instant invention further comprises coating a substrate with the novel antireflective coating composition and heating on a hotplate or convection oven at a sufficiently high temperature for sufficient length of time to remove the coating solvent in order to insolubilize the polymer to a sufficient extent so as not to be soluble in the coating solvent of the photoresist or in the aqueous alkaline developer. Various substrates known in the art may be used, such as those that are planar, have topography or have holes. The preferred range of temperature is from about 70° C. to about 250° C., preferably from about 100° C. to about 200° C. If the temperature is below 70° C. then insufficient loss of solvent or insufficient degree of insolubilization takes place and at temperatures above 250° C. the polymer may become chemically unstable. The exact temperature to be used is determined by the specific application. A film of a photosensitive material is then coated on top of the antireflective coating and baked to substantially remove the photoresist solvent. The photoresist is imagewise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate is then dry etched. The etching may be carried out in a suitable etch chamber to remove the exposed portions of the antireflective film, with the remaining photoresist acting as an etch mask. Optional heating steps may be included to optimize the etching process. Various etching techniques known in the art may be used.

The absorption parameter (k) of the novel composition ranges from about 0.1 to about 1.0, preferably from about 0.15 to about 0.7 as measured using ellipsometry. The refractive index (n) of the antireflective coating is also optimized. The n and k values can be calculated using an ellipsometer, such as the J. A. Woollam WVASE VU-302 TM Ellipsometer. The exact values of the optimum ranges for k and n are dependent on the exposure wavelength used and the type of application. Typically for 193 nm the preferred range for k is 0.1 to 0.75, for 248 nm the preferred range for k is 0.15 to 0.8, and for 365 nm the preferred range is from 0.1 to 0.8. The thickness of the antireflective coating is less than the thickness of the top photoresist. Preferably the film thickness of the antireflective coating is less than the value of (wavelength of exposure/refractive index), and more preferably it is less than the value of (wavelength of exposure/(2 times refractive index)), where the refractive index is that of the antireflective coating and can be measured with an ellipsometer. The optimum film thickness of the antireflective coating is determined by the exposure wavelength, refractive indices of the antireflective coating and of the photoresist, absorption characteristics of the top and bottom coatings, and optical characteristics of the substrate. Since the bottom antireflective coating must be removed by exposure and development steps, the optimum film thickness is determined by avoiding the optical nodes where no light absorption is present in the antireflective coating.

An intermediate layer may be placed between the antireflective coating and the photoresist to prevent intermixing, and is envisioned as lying within the scope of this invention. The intermediate layer is an inert polymer cast from a solvent, where examples of the polymer are polysulfone and polyimides.

Another process that requires a bottom coat, such as the one of the present invention, is one where the photosensitive layer can be silylated to produce an etch resistant mask for etching the bottom coat. Such a process comprises forming a coating on a substrate with a bottom coat using the composition of the present invention, forming a photosensitive layer, imaging and developing the photosensitive layer, silylating this photosensitive layer with an appropriate silylating agent, and etching the bottom coat using the silylated photosensitive image as a mask. The concept of silylation is known to those skilled in the art and is described in the reference, Sebald et al, SPIE, Vol.1262, pages 528-537,1990. The photoresist to be silylated is designed, as known in the art, to be one capable of silylation. It has been found that the bottom coat of this invention is especially well-suited to this process since it has optimum etch properties.

Another process for which the present invention is useful is in trilayer applications. For example, in 193-nm exposures, the microchip industry typically uses roughly 270-350 nm of resist on 32-80 nm of bottom anti-reflective coating—so-called single layer processing. For trilayer applications, photoresist thicknesses (~150-200 nm) are much less than for single layer applications, resulting in low aspect ratio lines. The trilayer bottom anti-reflective coating instead is about 300-700 nm thick, and the middle layer is about 30-215 nm thick. The advantages of the trilayer resist processing include: (a) reduced resist aspect ratios; (b) the ability to use conventional or ultra-thin photoresists rather than silicon-containing and hydrophobic (bilayer) resists; (c) minimized interaction of resist with the substrate; (d) optimum thickness control for the imaging, masking, and anti-reflective layer; and (e) improved depth-of-focus (DOF) since the trilayer bottom anti-reflective coatings are designed to be highly planarizing.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

Examples of antireflective formulations containing a self crosslinking resin are shown below.

EXAMPLE 1

Reaction of Poly(allyl alcohol-co-styrene) with N,N,N,N-tetra(methoxymethyl)glycoluril 20.0 g of poly(allyl alcohol-co-styrene) copolymer (Aldrich, Mw 2K, allyl alcohol 33 mol %), 10.6 g N,N,N,N-tetra (methoxymethyl)glycoluril (Powderlink 1174, Cytec Industries), 0.15 g of p-toluenesulfonic acid (Aldrich), and 155 g tetrahydrofuran (THF) was stirred at room temperature for 5 days. The reaction product was precipitated by pouring the solution into 10000 mL distilled water, separated by vacuum filtration and dried in a vacuum desiccator overnight to afford 17.8 g of white powdery resin. Mw=5.2K (GPC/PS standard).

EXAMPLE 2

Antireflective Formulation 1.0 g of functionalized poly(allyl alcohol-co-styrene) resin from Example 1, 0.01 g dodecylbenzylsulfonium triethylammonium salt (DDBSA:Et$_3$N), and 40.0 g 70/30 ArF-thinner (AZ Electronic Materials USA Corp.) were combined and rolled overnight in a plastic bottle and then passed through 0.2 μm PTFE pore filters. Spin casting followed by baking at 200° C. for 60 seconds resulted in a film that could not be removed after soaking in ArF-thinner and maintain the same film thickness (FT) before and after soaking. Variable Angle Spectroscopic Elipsometer FT 41 nm; the optimized reflective index "n" at 193 nm was 1.81 and the absorption parameter "k" was 0.76.

EXAMPLE 3

Synthesis of Poly(hydroxyethyl methacrylate-co-benzyl methacrylate) (Abbreviated HB)

83.2 g of benzyl methacrylate, 25.8 g of hydroxyethyl methacrylate (feed ratio of benzyl methacrylate/hydroxyethyl methacrylate—80/20), 500 mL THF and 2 g AIBN were combined, in that order, to a 1 L round bottom flask. The solution was refluxed for 12 hr under nitrogen. After cooling, the polymer was recovered by precipitation into 4 L of hexane, filtered and dried in a vacuum desiccator. The polymer was produced in a 98.5% yield. Mw=30K (GPC/PS standard).

EXAMPLE 4

Reaction of HB with N,N,N,N-tetra(methoxymethyl)glycoluril 7.2 g of the polymer from Example 3, 3.6 g N,N,N,N-tetra (methoxymethyl)glycoluril (Powderlink 1174, Cytec Industries), 0.054 g of p-toluenesulfonic acid (Aldrich), and 56 g THF were stirred at room temperature for 2 days. The resulting reaction product was precipitated in distilled water and dried in a vacuum desiccator overnight to afford 6.7 g of white powdery resin. Mw=34K (GPC/PS standard).

EXAMPLE 5

Antireflective Formulation 1.0 g of functionalized HB resin from Example 4, 0.01 g dodecylbenzylsulfonium triethylammonium salt (DDBSA: Et$_3$N), and 40 g 70/30 ArF-thinner (AZ Electronic Materials USA Corp.) were combined and rolled overnight in a plastic bottle and then passed through 0.2 μm PTFE pore filters. Spin casting followed by baking at 200° C. for 60 seconds resulted in a film that could not be removed after soaking in ArF-thinner and maintain the same FT before and after soaking. Variable Angle Spectroscopic Elipsometer FT 40 nm; the optimized reflective index "n" at 193 nm was 1.86 and the absorption parameter "k" was 0.76.

What invention claimed is:
1. A polymer consisting of the reaction product between poly(hydroxyethyl methacrylate-co-benzyl methacrylate)

and N,N,N,N-tetra(methoxymethyl)glycoluril, wherein the polymer is capable of self-crosslinking under acidic conditions.

2. An anti-reflective coating composition comprising (i) a polymer selected from the group consisting of the reaction product between poly(allyl alcohol-co-styrene) and N,N,N,N-tetra(methoxymethyl)glycoluril and the reaction product between poly(hydroxyethyl methacrylate-co-benzyl methacrylate) and N,N,N,N-tetra(methoxymethyl)glycoluril, wherein the polymer is capable of self-crosslinking under acidic conditions, (ii) a solvent; and a thermal acid generator.

3. The composition of claim 2 wherein for (i), the polymer is the reaction product between poly(allyl alcohol-co-styrene) and N,N,N,N-tetra(methoxymethyl)glycoluril.

4. The composition of claim 2 wherein for (i), the polymer is the reaction product between poly(hydroxyethyl methacrylate-co-benzyl methacrylate) and N,N,N,N-tetra(methoxymethyl)glycoluril.

\* \* \* \* \*